(12) United States Patent
Toh et al.

(10) Patent No.: US 9,276,041 B2
(45) Date of Patent: Mar. 1, 2016

(54) THREE DIMENSIONAL RRAM DEVICE, AND METHODS OF MAKING SAME

(75) Inventors: Eng Huat Toh, Singapore (SG); Elgin Quek, Singapore (SG); Shyue Seng Tan, Singapore (SG)

(73) Assignee: GLOBALFOUNDRIES Singapore PTE LTD, Singapore (SG)

( * ) Notice: Subject to any disclaimer, the term of this patent is extended or adjusted under 35 U.S.C. 154(b) by 442 days.

(21) Appl. No.: 13/423,793

(22) Filed: Mar. 19, 2012

(65) Prior Publication Data

US 2013/0240821 A1  Sep. 19, 2013

(51) Int. Cl.
*H01L 47/00* (2006.01)
*H01L 27/24* (2006.01)
*H01L 45/00* (2006.01)

(52) U.S. Cl.
CPC .......... *H01L 27/2409* (2013.01); *H01L 27/249* (2013.01); *H01L 27/2445* (2013.01); *H01L 45/04* (2013.01); *H01L 45/1226* (2013.01); *H01L 45/146* (2013.01); *H01L 45/147* (2013.01); *H01L 45/1675* (2013.01)

(58) Field of Classification Search
CPC ..... H01L 45/04; H01L 27/24; H01L 29/4236; H01L 27/10894; H01L 27/108; H01L 27/0802; H01L 28/20; H01L 29/861; H01L 29/8611; H01L 29/8613; H01L 27/2418; H01L 27/2445; H01L 27/2409; H01L 27/2436; H01L 21/8239; H01L 21/8249; H01L 29/8605
USPC ............. 257/4, 296, 313, 315, 316, 528, 536, 257/300, 307, 905, 907, 908, 331; 438/382
See application file for complete search history.

(56) References Cited

U.S. PATENT DOCUMENTS

| | | |
|---|---|---|
| 4,507,159 A | 3/1985 | Erb |
| 4,676,866 A | 6/1987 | Tang et al. |
| 5,099,305 A | 3/1992 | Takenaka et al. |
| 5,173,760 A | 12/1992 | Min et al. |
| 5,332,682 A | 7/1994 | Lowrey |
| 5,973,381 A | 10/1999 | Kudo et al. |
| 6,403,482 B1 | 6/2002 | Rovedo et al. |
| 6,531,371 B2 | 3/2003 | Hsu et al. ....................... 438/385 |
| 6,642,607 B2 | 11/2003 | Ohnishi et al. |
| 6,867,996 B2 | 3/2005 | Campbell et al. ............. 365/100 |
| 6,870,755 B2 | 3/2005 | Rinerson et al. ............... 365/148 |
| 6,946,702 B2 | 9/2005 | Jang ............................... 257/306 |
| 6,960,500 B2 | 11/2005 | Shin et al. |
| 7,067,865 B2 | 6/2006 | Lung ............................. 257/296 |
| 7,149,108 B2 | 12/2006 | Rinerson et al. |
| 7,157,750 B2 | 1/2007 | Bulovic et al. ................ 257/200 |

(Continued)

OTHER PUBLICATIONS

Deng et al., "Salicidation process using NiSi and its device application," *J. Appl. Phys.*, 81:8047-51, 1997.

(Continued)

*Primary Examiner* — Thanh Y Tran
(74) *Attorney, Agent, or Firm* — Amerson Law Firm, PLLC

(57) ABSTRACT

Disclosed herein are various embodiments of novel three dimensional RRAM devices, and various methods of making such devices. In one example, a device disclosed herein includes a first electrode for a first bit line comprising a variable resistance material, a second electrode for a second bit line comprising a variable resistance material and a third electrode positioned between the variable resistance material of the first bit line and the variable resistance material of the second bit line.

26 Claims, 12 Drawing Sheets

(56) References Cited

U.S. PATENT DOCUMENTS

| | | | |
|---|---|---|---|
| 7,238,984 B2 | 7/2007 | Shibata et al. | |
| 7,292,469 B2 | 11/2007 | Lee et al. | 365/163 |
| 7,426,128 B2 | 9/2008 | Scheuerlein | |
| 7,569,844 B2 | 8/2009 | Lung | 257/2 |
| 7,606,055 B2 | 10/2009 | Liu | 365/51 |
| 7,786,461 B2 | 8/2010 | Lung | 257/2 |
| 7,875,493 B2 | 1/2011 | Lung | 438/95 |
| 7,956,344 B2 | 6/2011 | Lung | 257/4 |
| 8,115,586 B2 | 2/2012 | Hosoi et al. | 338/20 |
| 8,174,865 B2 | 5/2012 | Rhie et al. | 365/148 |
| 8,183,126 B2 | 5/2012 | Lee et al. | 438/455 |
| 8,304,841 B2 | 11/2012 | Xu et al. | |
| 8,609,460 B2 | 12/2013 | Liu et al. | |
| 8,673,692 B2 | 3/2014 | Tan et al. | |
| 8,697,533 B2 | 4/2014 | Herner | |
| 8,835,896 B2 | 9/2014 | Miyagawa et al. | |
| 2002/0017657 A1 | 2/2002 | Coffa et al. | |
| 2002/0047163 A1 | 4/2002 | Sayama et al. | |
| 2002/0192881 A1 | 12/2002 | Ballantine et al. | |
| 2003/0017639 A1 | 1/2003 | Ballantine et al. | |
| 2005/0073678 A1 | 4/2005 | Tahir-Kheli et al. | |
| 2006/0035430 A1 | 2/2006 | Gutsche et al. | |
| 2007/0008865 A1 | 1/2007 | Adams et al. | |
| 2007/0066014 A1 | 3/2007 | Park et al. | |
| 2008/0001172 A1 | 1/2008 | Karg et al. | |
| 2008/0078985 A1 | 4/2008 | Meyer et al. | |
| 2008/0273370 A1* | 11/2008 | Keller | G11C 11/5614 365/148 |
| 2009/0103355 A1 | 4/2009 | Saitou | |
| 2009/0147558 A1 | 6/2009 | Tamai et al. | |
| 2010/0006813 A1 | 1/2010 | Xi et al. | |
| 2010/0237404 A1 | 9/2010 | Toba et al. | |
| 2010/0258779 A1* | 10/2010 | Mikawa et al. | 257/2 |
| 2011/0108829 A1 | 5/2011 | Banno | |
| 2012/0061639 A1* | 3/2012 | Yasuda | 257/2 |
| 2012/0074374 A1 | 3/2012 | Jo | 257/4 |
| 2012/0106232 A1 | 5/2012 | Meade | |
| 2012/0241709 A1 | 9/2012 | Tsuji | |
| 2013/0062588 A1 | 3/2013 | Sakotsubo | |
| 2013/0207067 A1* | 8/2013 | Pan et al. | 257/4 |

OTHER PUBLICATIONS

Gambino and Colgan, "Silicides and ohmic contacts," *Materials Chemistry and Physics*, 52:99-146, 1998.

Koshida et al., "Field-induced functions of porous Si as a confined system," *J. of Luminescence*, 80:37-42, 1999.

Liu et al., "Observation of Switching Behaviors in Post-Breakdown Conductions in NiSi-gated Stacks," IEDM09:135-138, 2009.

Ma et al., "Nonvolatile electrical bistability of organic/metal-nanocluster/organic system," *Applied Physics Letters*, 82:1419-21, 2003.

Raghavan et al., "Unipolar recovery of dielectric breakdown in fully silicided high-k gate stack devices and its reliability implications," *Applied Physics Letters*, 96:142901, 2010.

Rozenberg et al., "Nonvolatile Memory with Multilevel Switching: A Basic Model," *Physical Review Letters*, 92:178302, 2004.

Sakamoto et al., "Nanometer-scale switches using copper sulfide," *Applied Physics Letters*, 82:3032-34, 2003.

Terabe et al., "Ionic/electronic mixed conductor tip of a scanning tunneling microscope as a metal atom source for nanostructuring," *Applied Physics Letters*, 80:4009-11, 2002.

Chindalore et al., "Embedded Split-Gate Flash Memory with Silicon Nanocrystals for 90nm and Beyond," *2008 Symposium on VLSI Technology Digest of Technical Papers*, pp. 136-137, 2008.

Chiu et al., "A Low Store Energy, Low VDDmin, Nonvolatile 8T2R SRAM with 3D Stacked RRAM Devices for Low Power Mobile Applications," *2010 Symposium on VLSI Circuits/Technical Digest of Technical Papers*, pp. 229-230, 2010.

Kuegeler et al., "Materials, technologies, and circuit concepts for nanocrossbar-based bipolar RRAM," *Appl. Phys. A*, 102:791-809, 2011.

Lee et al., "2-stack 1D-1R Cross-point Structure with Oxide Diodes as Switch Elements for High Density Resistance RAM Applications," *2007 IEEE*, pp. 771-774, 2007.

Russo et al., "Filament Conduction and Reset Mechanism in NiO-Based Resistive-Switching Memory (RRAM) Devices," *IEEE Transactions on Electron Devices*, 56:186-192, 2009.

Sekar, "IEEE SCV EDS Technical Events, Nov. 16, 2010, Resistive RAM: Technology and Market Opportunities" Presentation, 2010.

Shimizu et al., "A Novel High-Density $5F^2$ NAND STI Cell Technology Suitable for 256Mbt and 1Gbit Flash Memories," *1997 IEEE*, pp. 97-271-97-274, 1997.

Tseng et al., "High Density and Ultra Small Cell Size of Conctact ReRAM (CR-RAM) in 90nm CMOS Logic Technology and Circuits," *2009 IEEE*, pp. 09-109-09-112, 2009.

Tsunoda et al., "Low Power and High Speed Switching of Ti-doped NiO ReRAM under the Unipolar Voltage Source of less than 3 V," *2007 IEEE*, pp. 767-770, 2007.

Wei et al., "Highly Reliable $TaO_x$ ReRAM and Direct Evidence of Redox Reaction Mechanism," *2008 IEEE*, pp. 293-296, 2008.

Whang et al., "Novel 3-Dimensional Dual Control-Gate with Surrounding Floating-Gate (DC-SF) NAND Flash Cell for 1Tb File Storage Application," *2010 IEEE*, pp. 10-668-10-671, 2010.

\* cited by examiner

THREE DIMENSIONAL RRAM DEVICE, AND METHODS OF MAKING SAME

BACKGROUND OF THE INVENTION

1. Field of the Invention

Generally, the present disclosure generally relates to sophisticated semiconductor devices and the manufacturing of such devices, and, more specifically, to various embodiments of novel three dimensional RRAM (Resistance Random Access Memory) devices, and various methods of making such three dimensional RRAM devices.

2. Description of the Related Art

As is well known to those skilled in the art, non-volatile memory (NVM) devices are characterized in that there is no loss of data stored in their memory cells, even when an external power supply is removed. For that reason, such non-volatile memory devices are widely employed in computers, mobile communication systems, memory cards and the like.

Flash memory structures are widely used in such non-volatile memory applications. The typical flash memory device employs memory cells having a stacked gate structure. The stacked gate structure typically includes a tunnel oxide layer, a floating gate, an inter-gate dielectric layer and a control gate electrode, which are sequentially stacked above a channel region. While flash memory structures have enjoyed enormous success, the continued and ever-present drive to reduce the size of integrated circuit products has created many challenges for the continued scaling of flash memory devices. Such challenges include scaling of program/erase voltages, access speed, reliability, the number of charges stored per floating gate, etc. Scaling attempts have included the fabrication of three dimensional floating gate memory devices where memory cells are stacked vertically. However, such stacking alone may not be sufficient to achieve the desired scaling of memory devices with critical dimensions less than 30 nm.

A resistance random access memory (RRAM) device is a simple two-terminal device memory device comprised of two spaced-apart electrodes with a variable resistance material layer or ion conductor layer positioned between the two electrodes. An RRAM is commonly connected in a 1T1R configuration, whereby the 1T (a transistor) is the selector and the 1R is an RRAM cell. The variable resistance material layer is typically comprised of various metal oxides, such as nickel oxide, titanium oxide, zirconium oxide, copper oxide, aluminum oxide, etc. The variable resistance material layer is used as a data storage layer. The resistance of the variable resistance material layer may be varied or changed based upon the polarity and/or amplitude of an applied electric pulse. The electric field strength or electric current density from the pulse, or pulses, is sufficient to switch the physical state of the materials so as to modify the properties of the material and establish a highly localized conductive filament (CF) in the variable resistance material. The pulse is of low enough energy so as to not destroy, or significantly damage, the material. Multiple pulses may be applied to the material to produce incremental changes in properties of the material. One of the properties that can be changed is the resistance of the material. The change may be at least partially reversible using pulses of opposite polarity or pulses having a different amplitude from those used to induce the initial change.

The present disclosure is directed to various embodiments of novel three dimensional RRAM devices, and various methods of making such RRAM devices that may improve bit densities and may lower the cost per bit of memory devices.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a novel three dimensional RRAM (Resistance Random Access Memory) device, and various methods of making such a three dimensional RRAM device. In one example, a device disclosed herein includes a first electrode for a first bit line comprising a variable resistance material, a second electrode for a second bit line comprising a variable resistance material and a third electrode positioned between the variable resistance material of the first bit line and the variable resistance material of the second bit line.

In another example, another device disclosed herein includes a first electrode for a first bit line, a second electrode for a second bit line, a common electrode positioned between the first and second electrodes, a first variable resistance material layer positioned between the first electrode and the common electrode, wherein the first variable resistance material layer is conductively coupled to the first electrode and the common electrode, and a second variable resistance material layer positioned between the second electrode and the common electrode, wherein the second variable resistance material layer is conductively coupled to the second electrode and the common electrode.

Yet another illustrative RRAM device disclosed herein includes a plurality of stacked bit levels, wherein each bit level comprises a first electrode for a first bit line that includes a variable resistance material and a second electrode for a second bit line that includes a variable resistance material. This illustrative embodiment further includes a third electrode that extends through the plurality of stacked bit levels, wherein, for each of the bit levels, the third electrode is positioned between the variable resistance material of the first bit line and the variable resistance material of the second bit line.

One illustrative method disclosed herein includes forming a bit level comprised of first and second spaced-apart conductive electrodes and a variable resistance material positioned between the first and second spaced-apart conductive electrodes, forming an opening in the variable resistance material and forming a third conductive electrode in the opening.

BRIEF DESCRIPTION OF THE DRAWINGS

The disclosure may be understood by reference to the following description taken in conjunction with the accompanying drawings, in which like reference numerals identify like elements, and in which.

Figure 1A:
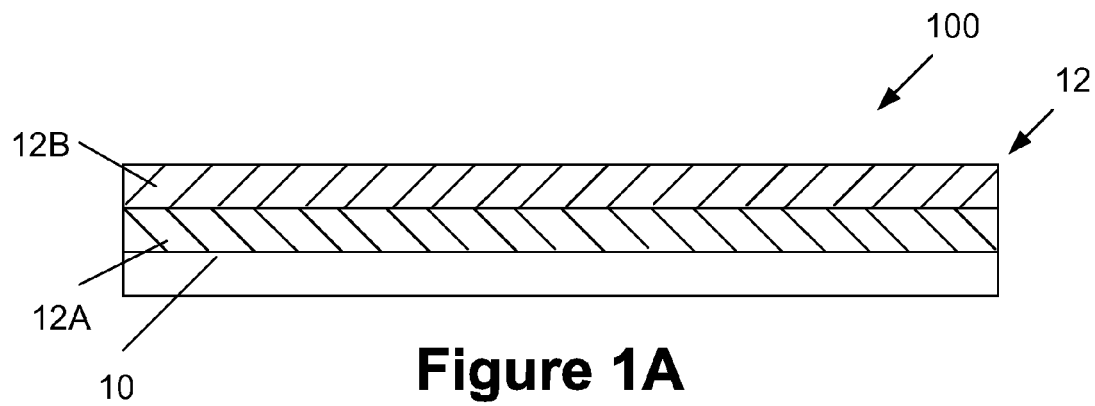
FIGS. 1A-1H depict one illustrative process flow for forming various illustrative embodiments of novel three dimensional RRAM devices disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various embodiments of a novel three dimensional RRAM (Resistance Random Access Memory) device, and various methods of making such three dimensional RRAM devices. As will be readily apparent to those skilled in the art upon a complete reading of the present application, the device disclosed herein may be employed with a variety of technologies, e.g., NMOS, PMOS, CMOS, etc., and it may be incorporated into a variety of integrated circuit products. With reference to the attached drawings, various illustrative embodiments of the methods and devices disclosed herein will now be described in more detail. It should be understood that the various features and layers in the attached drawing may not be to scale so as to facilitate disclosure of the present inventions.

FIGS. 1A-1H depict one illustrative process flow for forming one illustrative embodiment of a novel three dimensional RRAM device 100 disclosed herein. FIG. 1A is a simplified view of one illustrative embodiment of the novel three dimensional RRAM device 100 disclosed herein at an early stage of manufacturing. The three dimensional RRAM device 100 is formed above a structure 10. The structure 10 may be a layer of insulating material, such as, for example, a layer of silicon dioxide, or it may be a semiconductor material, such as a semiconducting substrate, or it may be a conductor, such as a metal word line. In the case where the structure 10 is a layer of insulating material, it may be formed using a variety of techniques, e.g., chemical vapor deposition (CVD), its thickness may vary depending upon the particular application, and it may be formed at any level of an integrated circuit product. In the case where the structure 10 is a semiconductor material, it may have a variety of configurations, such as the depicted bulk silicon configuration. The structure 10 may also have a silicon-on-insulator (SOI) configuration that includes a bulk silicon layer, a buried insulation layer and an active layer, wherein semiconductor devices are formed in and above the active layer. Thus, the terms structure, substrate or semiconductor substrate should be understood to cover all semiconductor structures. In the case where the structure 10 is a semiconductor material, it may be made of materials other than silicon, and it may be doped with an N-type dopant or a P-type dopant or it may be un-doped. In the case where the structure 10 is a conductor, such as a metal word line, it may be formed using a variety of techniques, e.g., CVD, patterned and etched into individual word lines (WL) or by depositing a layer of the conductor material into a patterned layer of insulating material, and thereafter performing a chemical mechanical polishing (CMP) to define the word lines.

FIG. 1A also depicts the three dimensional RRAM device 100 after doped layers of material 12A, 12B are formed in or above the structure 10. The layers 12A, 12B are doped with opposite type dopant material, e.g., the layer 12A is doped with an N-type dopant while the layer 12B is doped with a P-type dopant, or vice-versa. As described more fully below, in this illustrative example of the three dimensional RRAM device 100 disclosed herein, the doped layers 12A and 12B form a diode 12 and a word line (not shown) will be conductively coupled to the layer 12A. The thickness of the layers 12A, 12B and the dopant concentration in each of those layers may vary depending upon the particular application, and the layers 12A, 12B need not have the same dopant concentration or thickness, although they may in some applications. For example, in one illustrative embodiment, the layers 12A, 12B may have a thickness of about 100 nm. In the case where the structure 10 is a semiconductor material, the layers 12A, 12B may be formed by performing a plurality of traditional ion implantation processes, or by depositing or growing one or more of the layers 12A, 12B on or above the semiconductor material. In the case where the layers 12A, 12B are grown or deposited above the semiconductor material, the dopants may be introduced into the layers 12A, 12B in situ or by performing ion implantation processes after the layers are initially formed. In the case where the structure 10 is a layer of insulating material, the layers 12A, 12B may be formed by depositing the layers 12A, 12B above the structure and introducing the appropriate dopant material either in situ or by performing multiple ion implantation processes. If desired, the word line could be a conductive material layer, such as a layer of metal, and the diode 12 comprised of the doped layers 12A, 12B could be formed above the layer of metal.

Figure 1B:
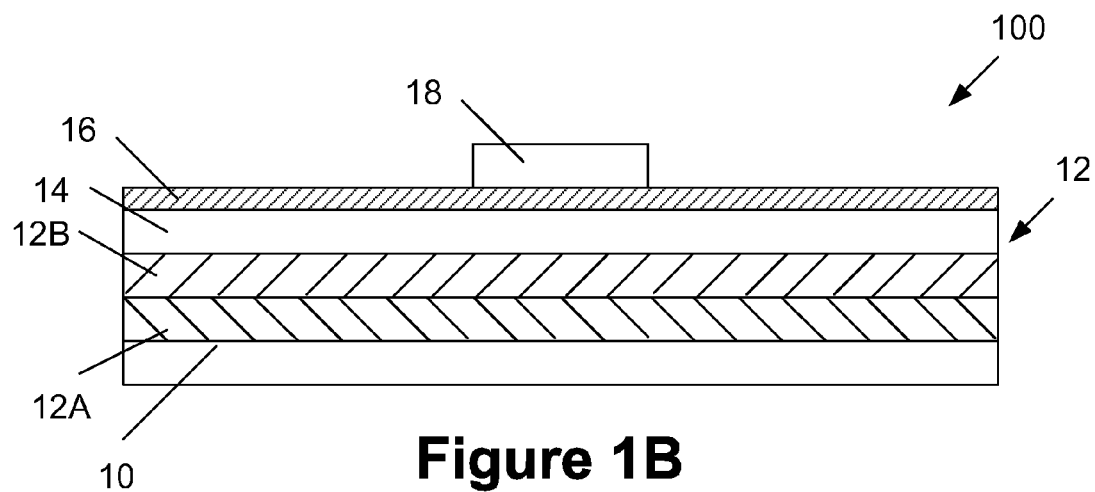

FIG. 1B depicts the three dimensional RRAM device 100 after a first layer of insulating material 14, an etch stop layer 16 and a patterned second layer of insulating material 18 have been formed above the device 100. In some applications, the etch stop layer 16 may not be required, i.e., when the first and second layers of insulating material 14, 18 are made of materials that may be selectively etched relative to one another. The first and second layers of insulating material 14, 18 are intended to be representative in nature as they may be a single layer of material (as depicted) or they each may be a stack comprised of multiple layers of materials. The first and second layers of insulating material 14, 18 may be comprised of one or more of a variety of different materials and they may be formed using a variety of techniques. For example, the first and second layers of insulating material 14, 18 may be comprised of a so-called ultra-low-k (k value less than 2.8) material, a low-k (k value less than 3) insulating material, a high-k (k value greater than 10) insulating material, silicon dioxide, etc., and each may have a thickness that may vary depending upon the particular application, e.g., in some cases they each may have an overall thickness of about 10-500 nm. The first and second layers of insulating material 14, 18 may be formed by performing any of a variety of known processing techniques, e.g., CVD, atomic layer deposition (ALD), etc., or plasma-enhanced versions of such processes. In one illustrative embodiment, the first and second layers of insulating material 14, 18 may be layers of silicon dioxide that are initially formed by performing a CVD process. The etch stop layer 16, if used, by be comprised of a variety of different materials, such as silicon nitride, that will serve to protect the underlying first layer of insulating material 14 during the etching process that is performed to define the patterned second layer of insulating material 18. The etch stop layer 16 may be formed by performing a variety of techniques, e.g., a CVD process, and it may have a thickness of about 10-50 nm. The patterned second layer of insulating material 18 may be formed by depositing an appropriate layer of material and thereafter performing an etching process through a patterned mask layer, such as a photoresist mask (not shown). Alternatively, in lieu of forming the two separate layers of insulating materials 14, 18 and the etch stop layer 16 therebetween as depicted in FIG. 1B, a single, relatively thick layer of insulating material could be formed and a stepped profile could be formed in this relatively thick layer of insulating material without the need of forming an etch stop layer. For example, a patterned photoresist mask could be formed above the relatively thick layer of insulating material and a timed etch process (wet or dry) could be performed through the patterned photoresist mask to remove exposed portions of the relatively thick layer of insulating material. The process would result in the relatively thick layer of insulating material having a stepped profile with a taller portion in the middle, much like what would be achieved if the etch stop layer 16 was omitted from FIG. 1B and the layers 14, 18 were a single layer of insulating material.

Figure 1C:
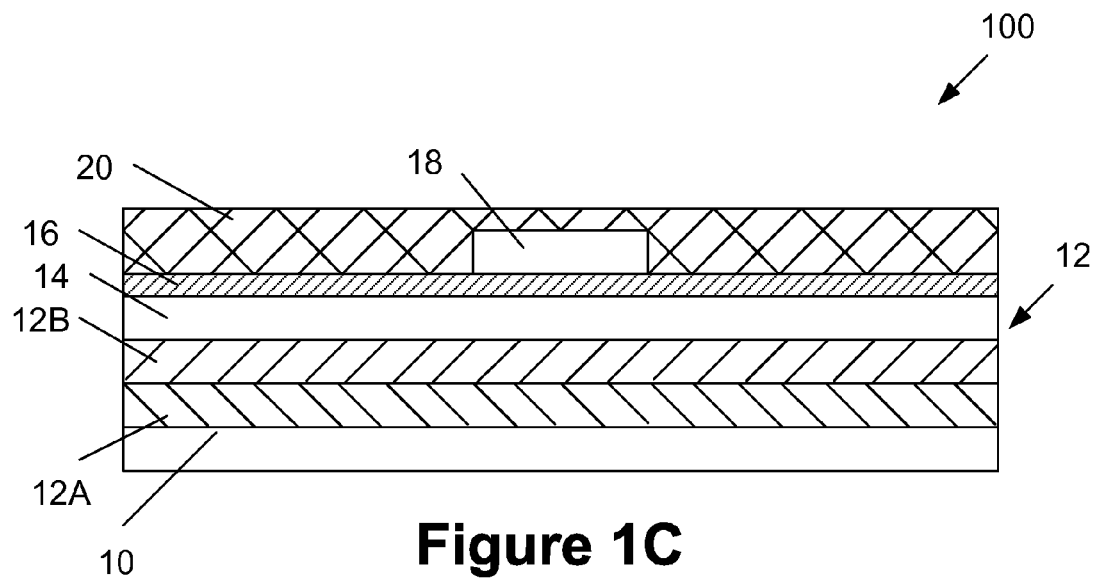

Next, as shown in FIG. 1C, a layer 20 of variable resistance material is formed for the three dimensional RRAM device 100. The variable resistance material layer 20 may be comprised of a material capable of having its resistivity changed in response to an electrical signal. The variable resistance material layer 20 may be formed by performing a variety of conformable deposition processes, such as a chemical vapor deposition (CVD) process, an atomic layer deposition (ALD) process, or plasma-enhanced versions of those processes, etc. In one illustrative embodiment, the variable resistance material layer 20 may have an "as-deposited" thickness within the range of about 10-500 nm depending upon the particular application. The variable resistance material layer 20 may be comprised of at least one of the following illustrative materials: a perovskite material, such as a colossal magnetoresistive (CMR) material or a high temperature superconducting (HTSC) material, for example $Pr_{0.7} Ca_{0.3}MnO_3$ (PCMO),s $Gd_{0.7} Ca0_{0.3} BaCo_2O_{5+5}$, a transition metal oxide such as hafnium oxide, titanium oxide, nickel oxide, tungsten oxide, tantalum oxide, copper oxide, etc., manganites, titanates (e.g., STO:Cr), zirconates (e.g., SZO:Cr, $Ca_2Nb_2O_7$:Cr, $Ta_2O_5$:Cr), and high Tc superconductors (e.g., YBCO), etc.

Figure 1D:
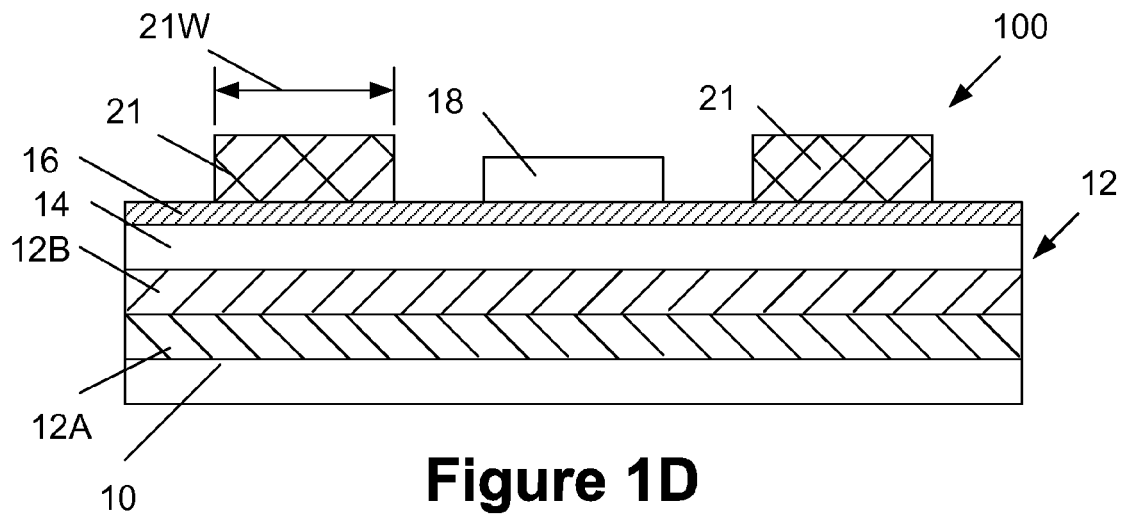

FIG. 1D depicts the device 100 after traditional photolithography and etching techniques have been performed to pattern the layer 20 (FIG. 1C) of variable resistance material and thereby define patterned layers or islands of variable resistance material 21. The mask layer used in such patterning operations, such as a patterned photoresist mask, is not depicted in FIG. 1D. In one illustrative embodiment, the features or islands in the patterned layer of variable resistance material 21 may have a width 21W of about 50-500 nm.

Figure 1E:
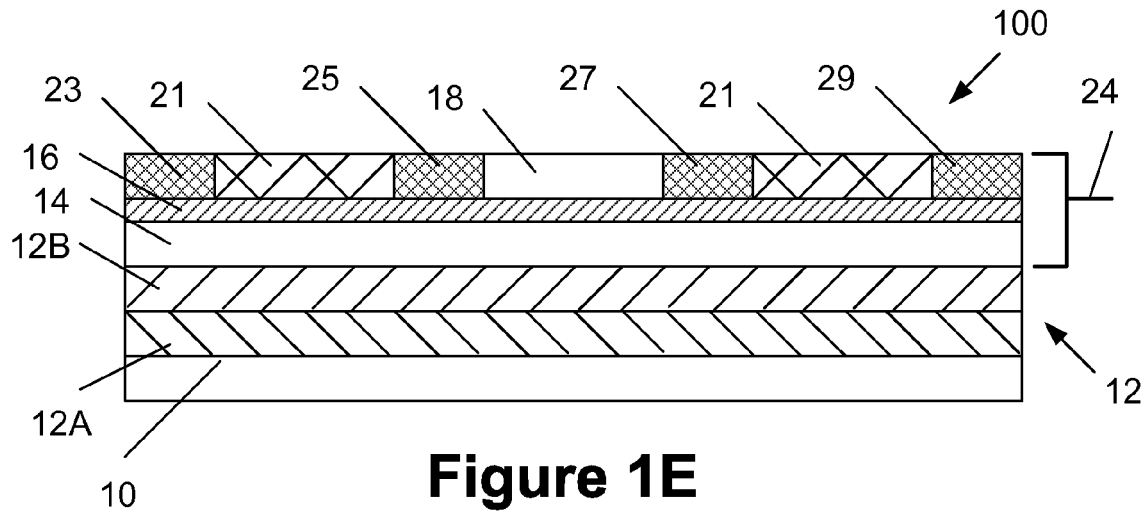

FIG. 1E depicts the three dimensional RRAM device 100 after several process operations have been performed. More specifically, multiple conductive electrodes 23, 25, 27 and 29 are formed on the device 100. The conductive electrodes 23, 25, 27 and 29 may be formed by blanket-depositing a layer of electrode material above the patterned layer of variable resistance material 21 and thereafter performing a chemical mechanical polishing (CMP) process to substantially planarize the upper surfaces of the various layers of material depicted in FIG. 1E. The conductive electrodes 23, 25, 27 and 29 may be comprised of a variety of different conductive materials, such as polysilicon, amorphous silicon, a metal or metal-containing material (e.g., aluminum, tungsten, silicon, platinum, titanium, titanium nitride, copper, gold), etc., and their thickness may vary depending upon the particular application, e.g., in some cases the electrodes may have a thickness within the range of about 50-500 nm. The initial layer of electrode material may be formed by performing a variety of deposition processes, such as a physical vapor deposition (PVD) process, a chemical vapor deposition (CVD) process, an atomic layer deposition (ALD) process, or plasma-enhanced versions of those processes, as well as by an electroplating or electroless deposition process, etc. To the extent that there are any barrier layers or liners that may be involved in the formation of the conductive electrodes 23, 25, 27 and 29, those layers or liners are not depicted in the attached drawings so as not to obscure the present inventions. In a very high-level view of the process flow just described, the variable resistance material layer 20 is deposited, the variable resistance material layer 20 is then patterned, the layer of electrode material is then deposited above the patterned layer of variable resistance material 21 and a CMP process is performed to define the conductive electrodes 23, 25, 27 and 29. As will be recognized by those skilled in the art after a complete reading of the present application, if desired, and if appropriate materials are employed, the process flow could essentially be reversed. That is, an alternative process flow would involve initially depositing a layer of etchable electrode material (e.g., aluminum, etc.), patterning the layer of electrode material to define the electrodes 23, 25, 27 and 29, depositing the variable resistance material layer 20 above the electrodes 23, 25, 27 and 29, and performing a CMP process to define the islands of the variable resistance material between the electrodes 23, 25, 27 and 29.

Figure 1F:
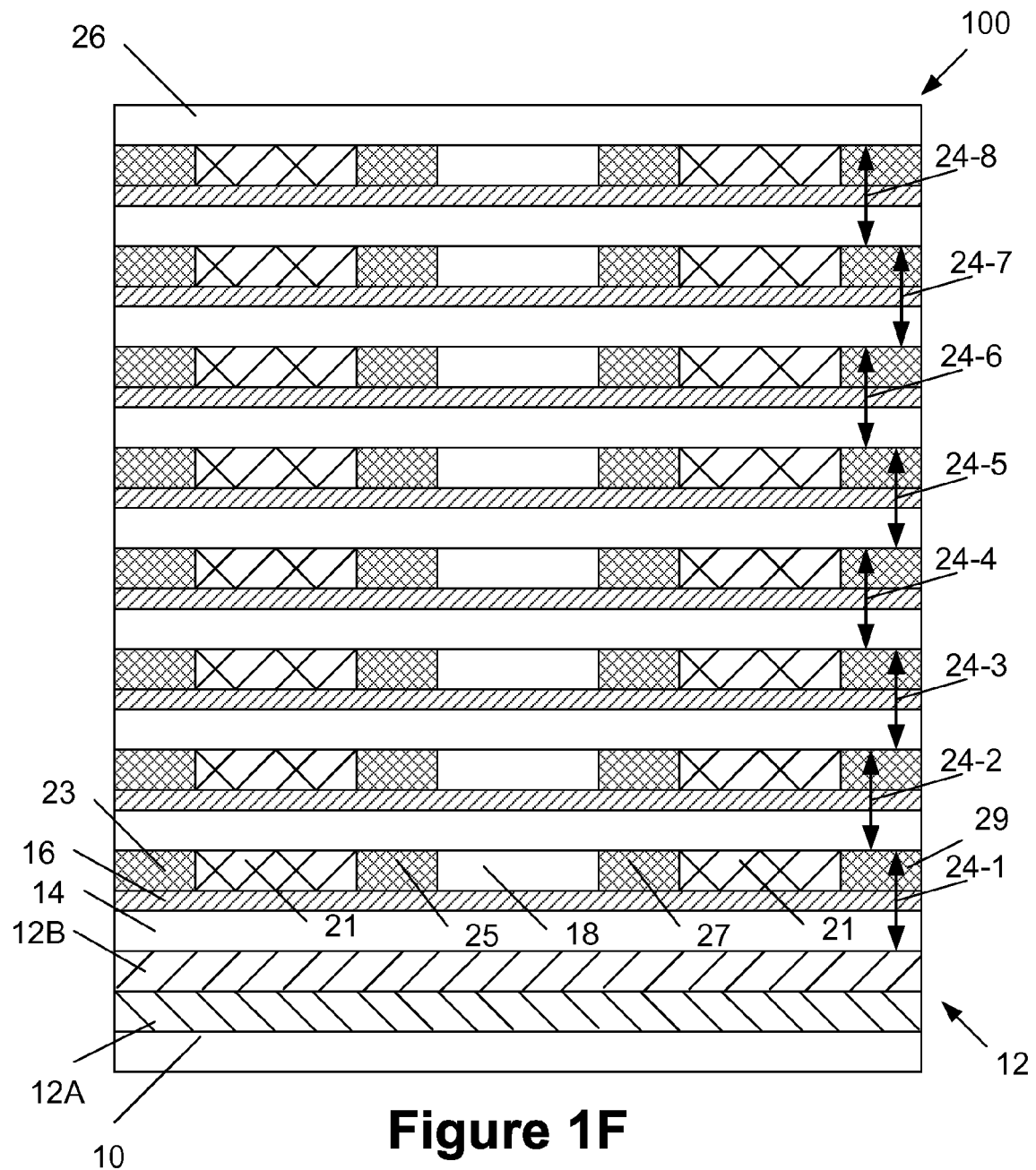

With reference to FIGS. 1E-1F, in the example depicted herein, the three dimensional RRAM device 100 comprises a basic bit level layer stack/configuration 24 shown in FIG. 1E that may be repeated for any desired number of levels. By way of example, FIG. 1F depicts one illustrative embodiment of a three dimensional RRAM device 100 comprised of eight such bit levels (24-1, 24-2 . . . 24-8). Also depicted in FIG. 1F is an illustrative capping layer 26 that may be comprised of a variety of insulating materials, such as those described above for the first layer of insulating material 14. As will be recognized by those skilled in the art after a complete reading of the present application, the number of levels on a particular three dimensional RRAM device 100 may vary depending upon the particular application. There is no upper limit on the number of bit levels 24 that may be present on any particular three dimensional RRAM device 100 other than the ability to manufacture a device with such a configuration.

Figure 1G:
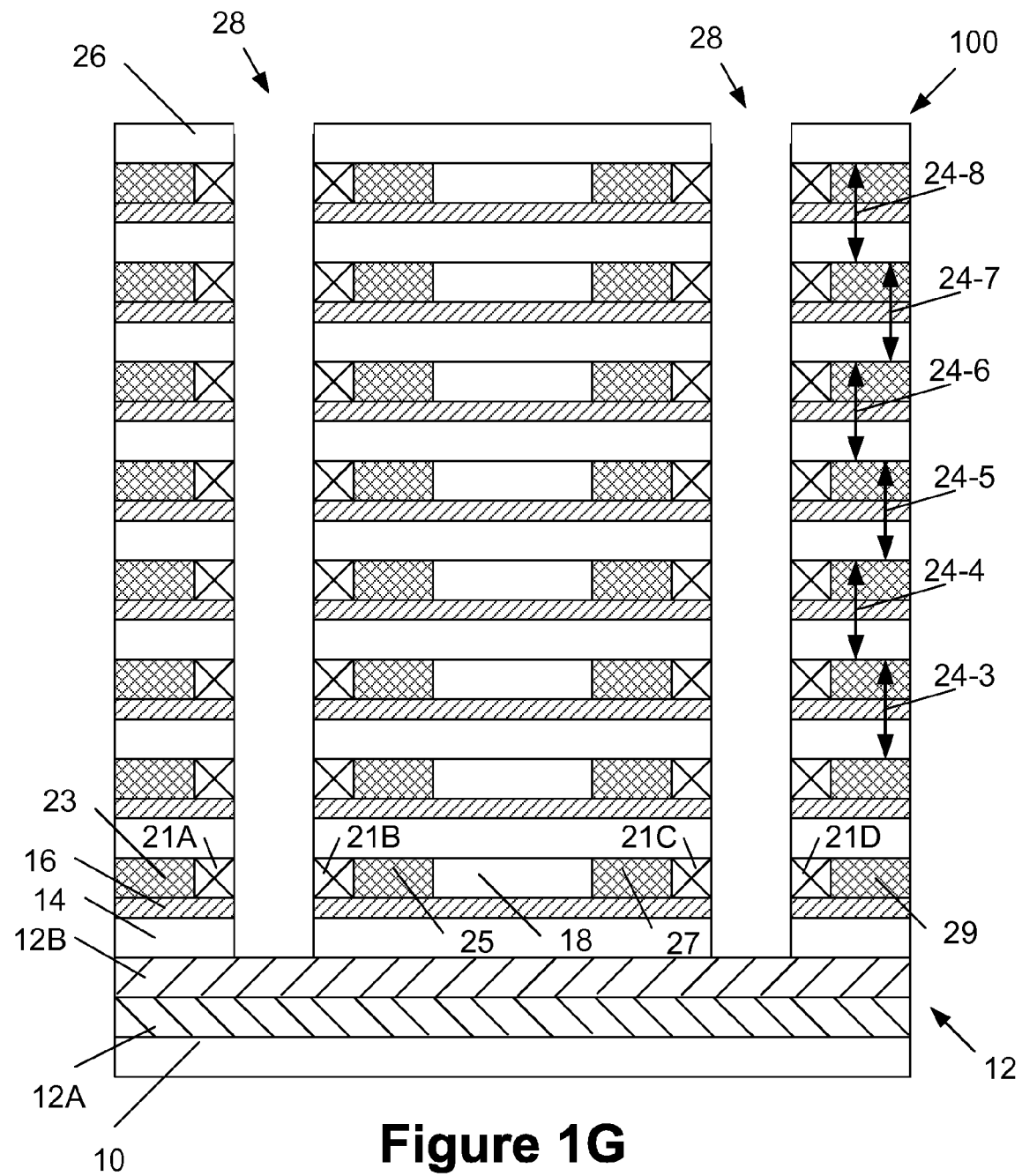
Figure 1H:
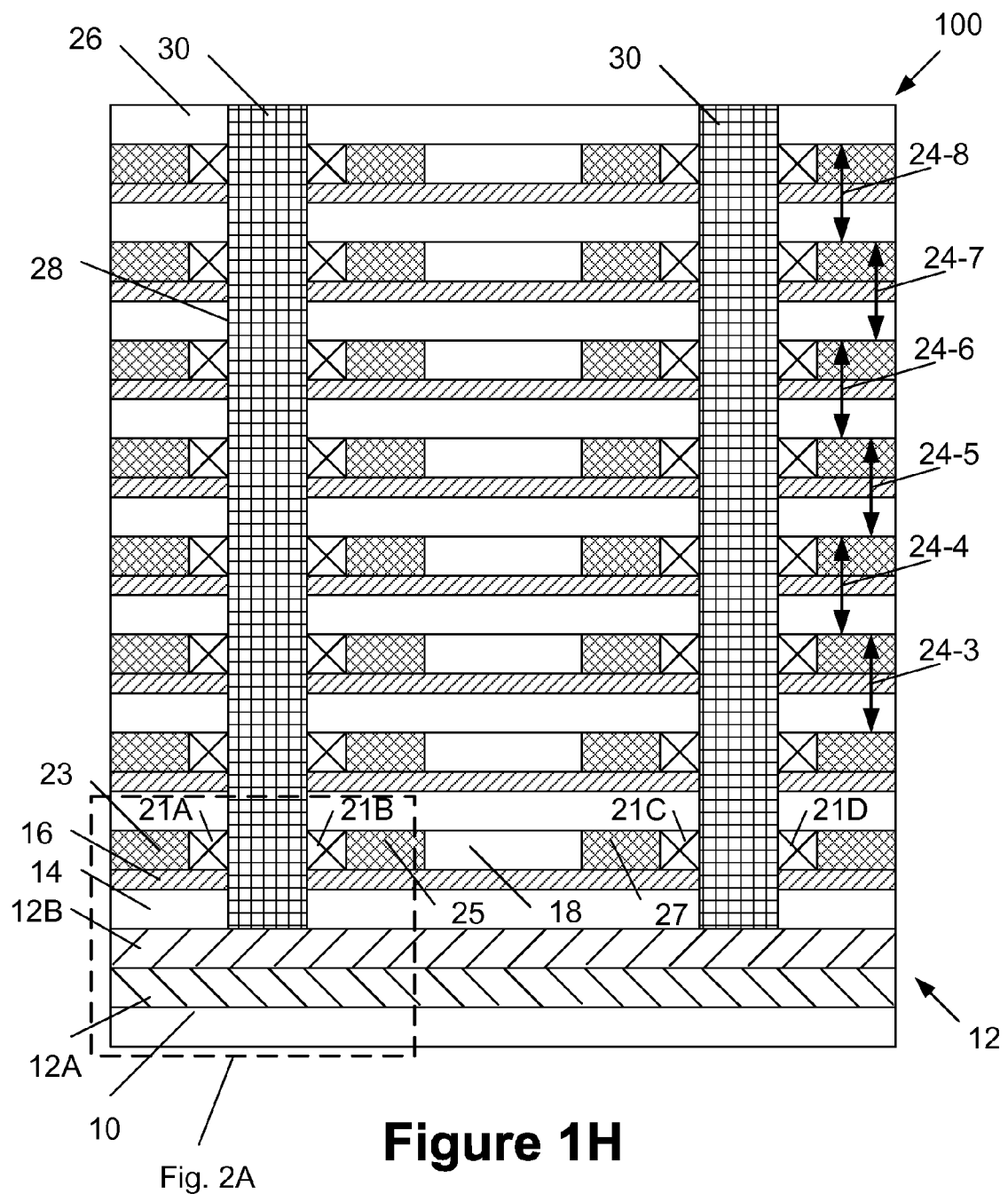

Next, as shown in FIGS. 1G-1H, a plurality of common electrodes 30 (see FIG. 1H) are formed for the illustrative embodiment of the three dimensional RRAM device 100 disclosed herein. In general, the common electrode 30 connects the RRAM cells to the diode 12 defined by the doped layers 12A, 12B. In a more general sense, the common electrode 30 is connected to an access/selector device for the RRAM memory cell disclosed herein. More specifically, traditional photolithography and etching techniques are performed to define a plurality of openings 28 that extend to the underlying doped layer 12B, as shown in FIG. 1G. Thereafter, a deposition process is performed to over-fill the openings 28 with a conductive material and a CMP process is then performed to remove excess amounts of the conductive material and thereby define the illustrative conductive common electrodes 30 shown in FIG. 1H. The common electrodes 30 may be comprised of the same conductive materials as described above for the conductive electrodes 23, 25, 27 and 29, although different materials may be employed if desired. To the extent that there are any barrier layers or liners that may be involved in the formation of the common electrodes 30, those layers or liners are not depicted in the attached drawings so as not to obscure the present inventions. The common electrodes 30 extend through the patterned layers of variable resistance material 21 and thereby define separated RRAM cells 21A, 21B, 21C and 21D comprised of variable resistance material for the device 100, as shown in FIG. 1H. As will be described more fully below, each of these separated RRAM cells 21A, 21B, 21C and 21D will be the storage layer for an individual bit line on the device 100.

Figure 2D:
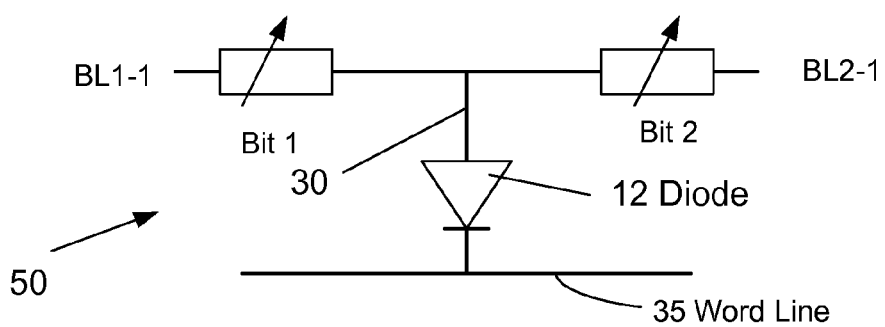
FIGS. 2A-2L depict various illustrative embodiments of novel three dimensional RRAM devices disclosed herein.
Figure 2A:
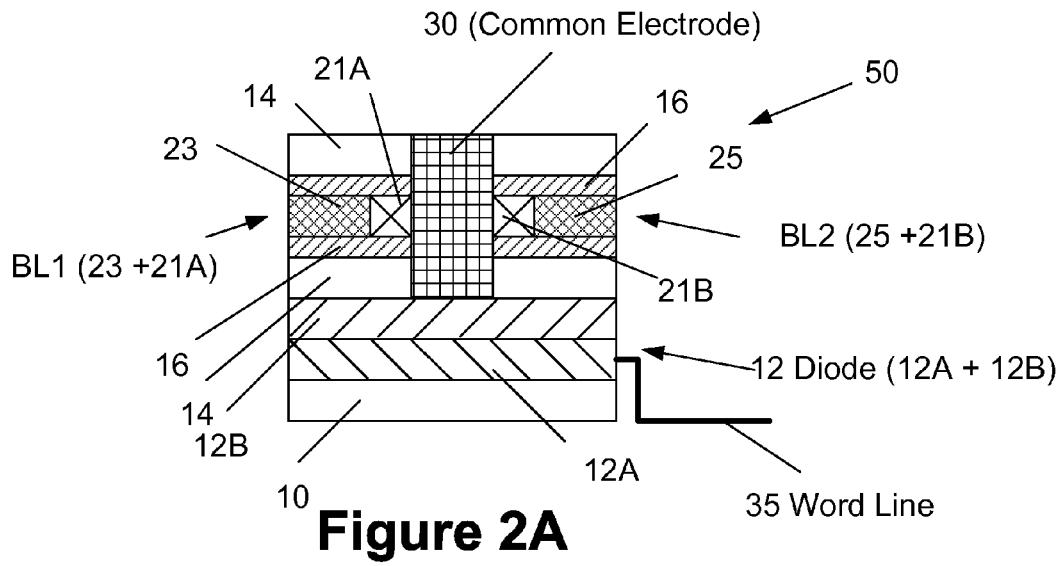
Figure 2C:
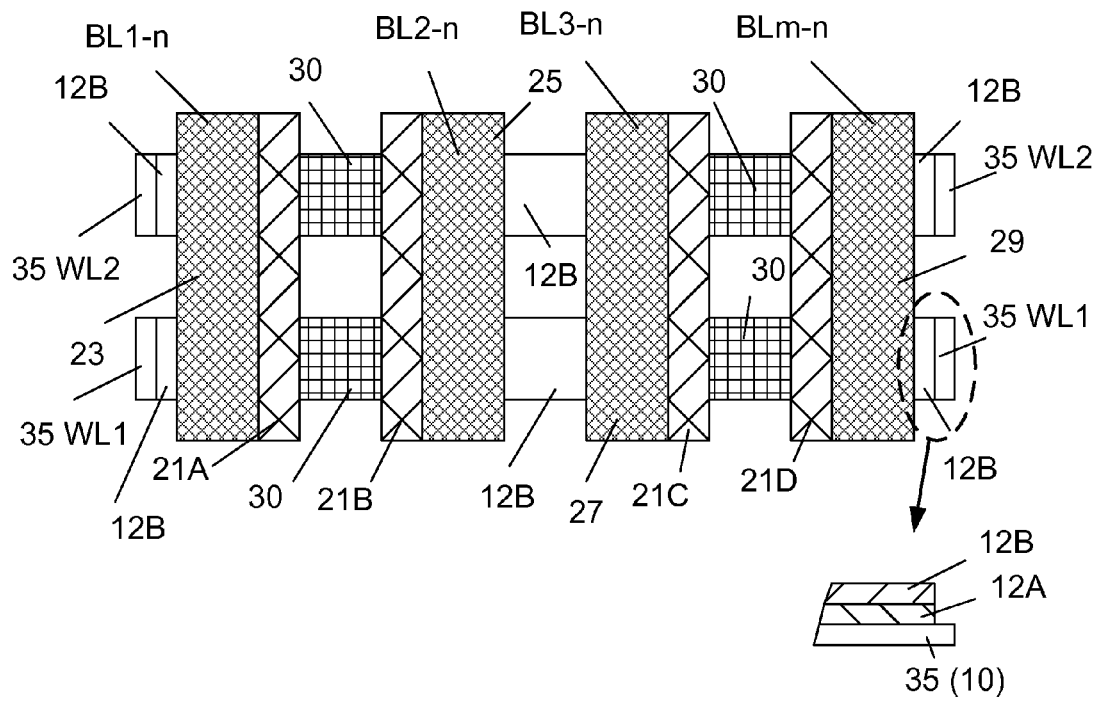

The basic structure and operation of one illustrative embodiment of a novel three dimensional RRAM device 100 disclosed herein will be further described with reference to FIGS. 2A-2D. FIG. 2A is a cross-sectional view of an illustrative embodiment of a multi-bit, single word line cell 50 disclosed herein, FIG. 2B is a cross-sectional view of an illustrative multi-level three dimensional RRAM device 100, FIG. 2C is a plan view of a portion of the illustrative example of a three dimensional RRAM device 100 disclosed herein and FIG. 2D is an electrical schematic for an illustrative multi-bit, single word line cell 50 depicted herein.

As shown in FIG. 2A, the illustrative embodiment of the multi-bit, single word line cell 50 disclosed herein is comprised of a diode 12 (doped layers 12A and 12B), a schematically depicted word line 35 that is conductively coupled to the diode 12, a first bit line "BL1" comprised of the conductive electrode 23 (which functions as a top electrode of a capacitor) and the RRAM cell 21A (which functions as the storage layer for the first bit line), a second bit line "BL2" comprised of the conductive electrode 25 (which functions as a top electrode of a capacitor) and the RRAM cell 21B (which functions as the storage layer for the second bit line), and a common electrode 30 that is conductively coupled to both the first and second bit lines and the diode 12. In this embodiment, the access/selector device for the RRAM cells 21A, 21B includes the diode 12. The word line 35 may take a variety of forms, e.g., it may be a conductive line, like the structure 10 depicted above, or it may simply be a contact at the end of the first doped layer 12A, or in some case the first doped layer 12A may function as a word line that connects all of the various access devices.

As mentioned previously, the RRAM device 100 comprises a plurality of multi-bit, single word line structures 50. As a general statement, the unit cell consists of three electrodes that are separated by two regions of RRAM material, wherein the middle electrode is a common electrode. More specifically, the illustrative RRAM device disclosed herein includes a first electrode (23) for a first bit line (BL1) that includes a variable resistance material (RRAM cell 21A), a second electrode (25) for a second bit line (BL2) that includes a variable resistance material (RRAM cell 21B) and a third or common electrode (30) that is positioned between the variable resistance material (RRAM cell 21A) of the first bit line (BL1) and the variable resistance material (RRAM cell 21B) of the second bit line (BL2). In another example, the RRAM device disclosed herein includes a first electrode (23) for the first bit line (BL1), a second electrode (25) for the second bit line (BL2) and a common electrode (30) that is positioned between the first and second electrodes. In this example, a first variable resistance material layer (RRAM cell 21A) is positioned between the first electrode (23) and the common electrode (30), wherein the first variable resistance material layer (RRAM cell 21A) is conductively coupled to the first electrode (23) and the common electrode (30), and a second variable resistance material layer (RRAM cell 21B) that is positioned between the second electrode (25) and the common electrode (30), wherein the second variable resistance material layer (RRAM cell 21B) is conductively (electrically) coupled to the second electrode (25) and the common electrode (30).

Figure 2B:
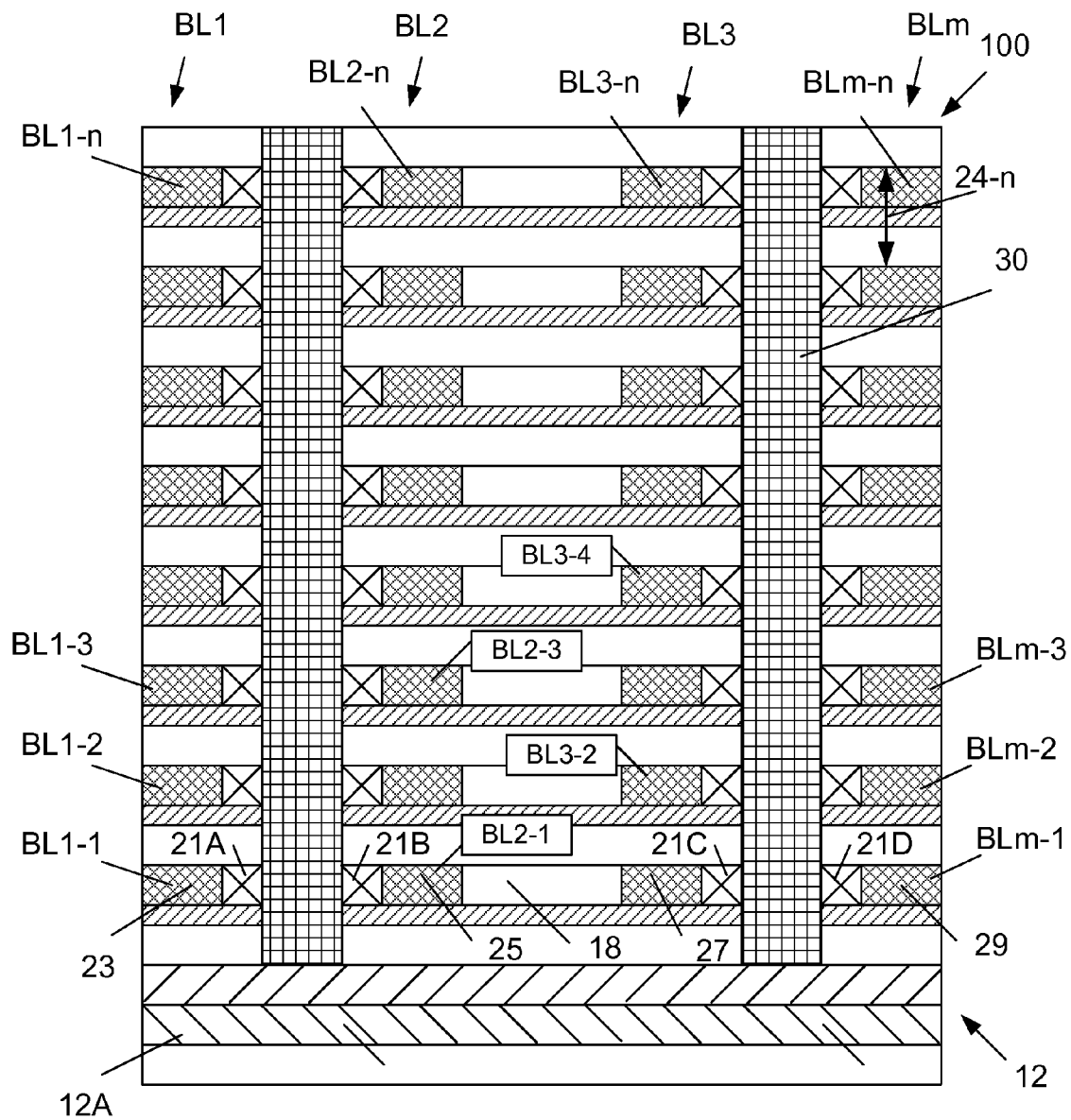

FIG. 2B depicts an illustrative example of a multi-level three dimensional RRAM device 100. As shown therein, the device 100 is comprised of a plurality of vertically-stacked bit lines: first bit lines ("BL1"), second bit lines ("BL2"), third bit line ("BL3") and "m" bit lines ("BLm") that are positioned in level 1 through level "n". As will be recognized by those skilled in the art after a complete reading of the present application, the total number of stacked bit lines for the device 100 is not limited to any particular number. By way of example, the designation "BL1-3" in FIG. 2B refers to the first bit line ("BL1") in the third level ("3") of the device; the designation "BL3-4" refers to the third bit line ("BL3") in the fourth level ("4") of the device 100, the designation "BLm-n" refers to the "m" bit line ("BLm") in the nth level ("n") of the device 100, etc. Thus, the illustrative RRAM device 100 disclosed herein includes a plurality of stacked bit levels (1-n), wherein each bit level comprises a first electrode (23) for a first bit line (BL1) that includes a variable resistance material (RRAM cell 21A) and a second electrode (25) for a second bit line (BL2) that includes a variable resistance material (RRAM cell 21B). This illustrative embodiment further includes a third or common electrode (30) that extends through the plurality of stacked bit levels (1-n), wherein, for each of the bit levels, the third or common electrode (30) is positioned between the variable resistance material (RRAM cell 21A) of the first bit line (BL1) and the variable resistance material (RRAM cell 21B) of the second bit line (BL2).

FIG. 2C is a partial view of the uppermost layer (the "n" layer) of the device 100 with layers of insulating material omitted for purposes of explanation. As shown therein, two illustrative word lines 35 (WL1 and WL2) are depicted although the device 100 may have any practical number of such word lines. In this illustrative embodiment, the word lines 35 are depicted as separate metal lines positioned below the first and second doped layers 12A, 12B (see detailed drawing on FIG. 2C). As described more fully below, the unique configuration of the illustrative three dimensional RRAM device 100 disclosed herein permits accessing, reading to, or writing from one of two bit lines (e.g., BL1 or BL2, whichever one is selected) via a single common electrode 30. In the depicted embodiment, the common electrodes 30 have a substantially square configuration; however, they may be of any desired shape or form.

FIG. 2D is an electrical schematic of the illustrative cell 50 depicted in FIG. 2A. As depicted, the common electrode 30 is conductively coupled to "Bit 1," "Bit 2" and the diode 12. The diode 12 (layers 12A/12B) allows a current flowing through whichever of the bits (Bit 1 or Bit 2) that is selected to pass to the word line 35 where it may be sensed by traditional sensing circuitry (not shown) employed in modern memory devices. The magnitude of this current is reflective of the resistive state of the bit and thus may be employed in memory applications. FIG. 2D is an electrical schematic of the illustrative device 100 depicted in FIG. 2B.

Figure 2E:
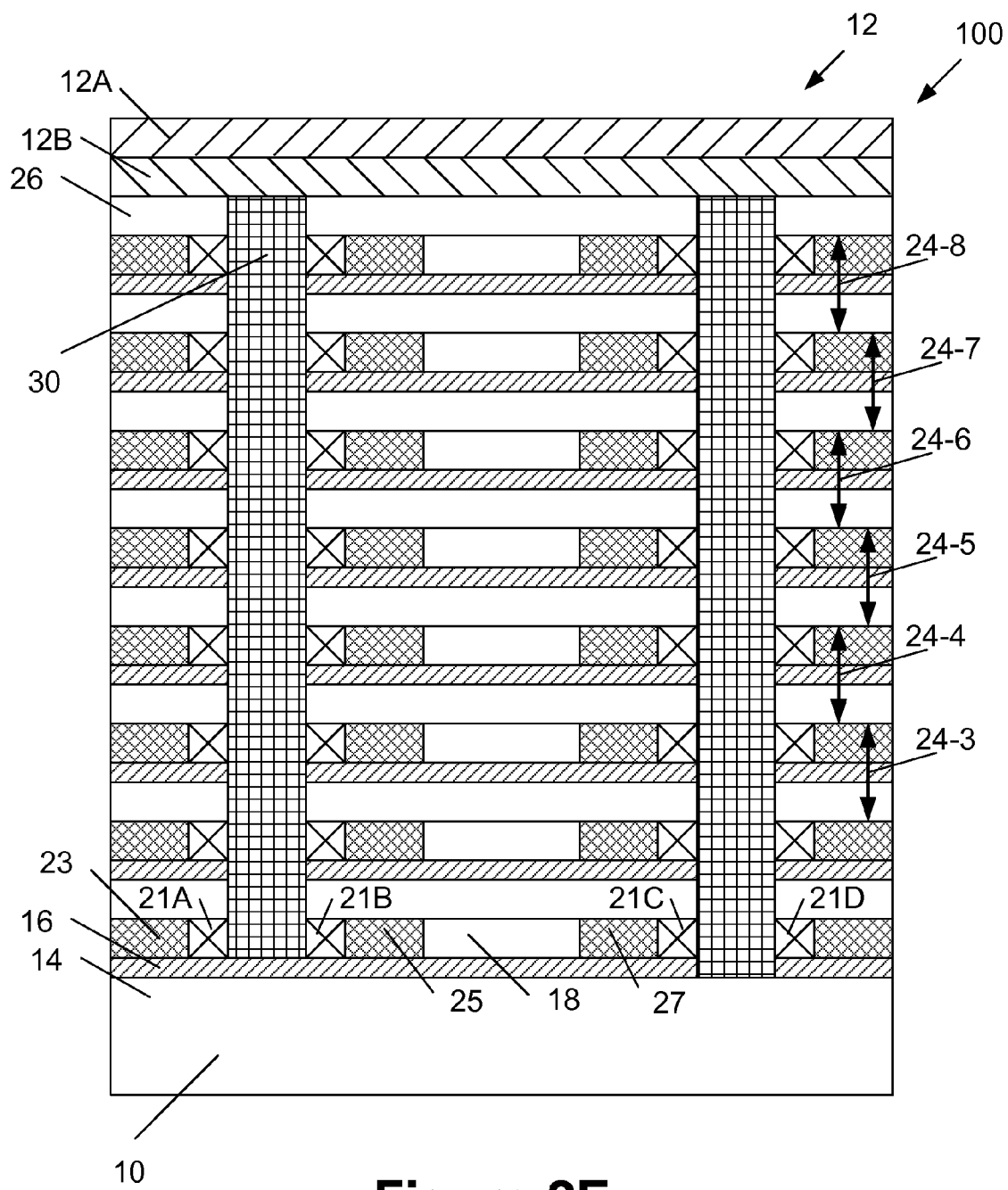
Figure 2F:
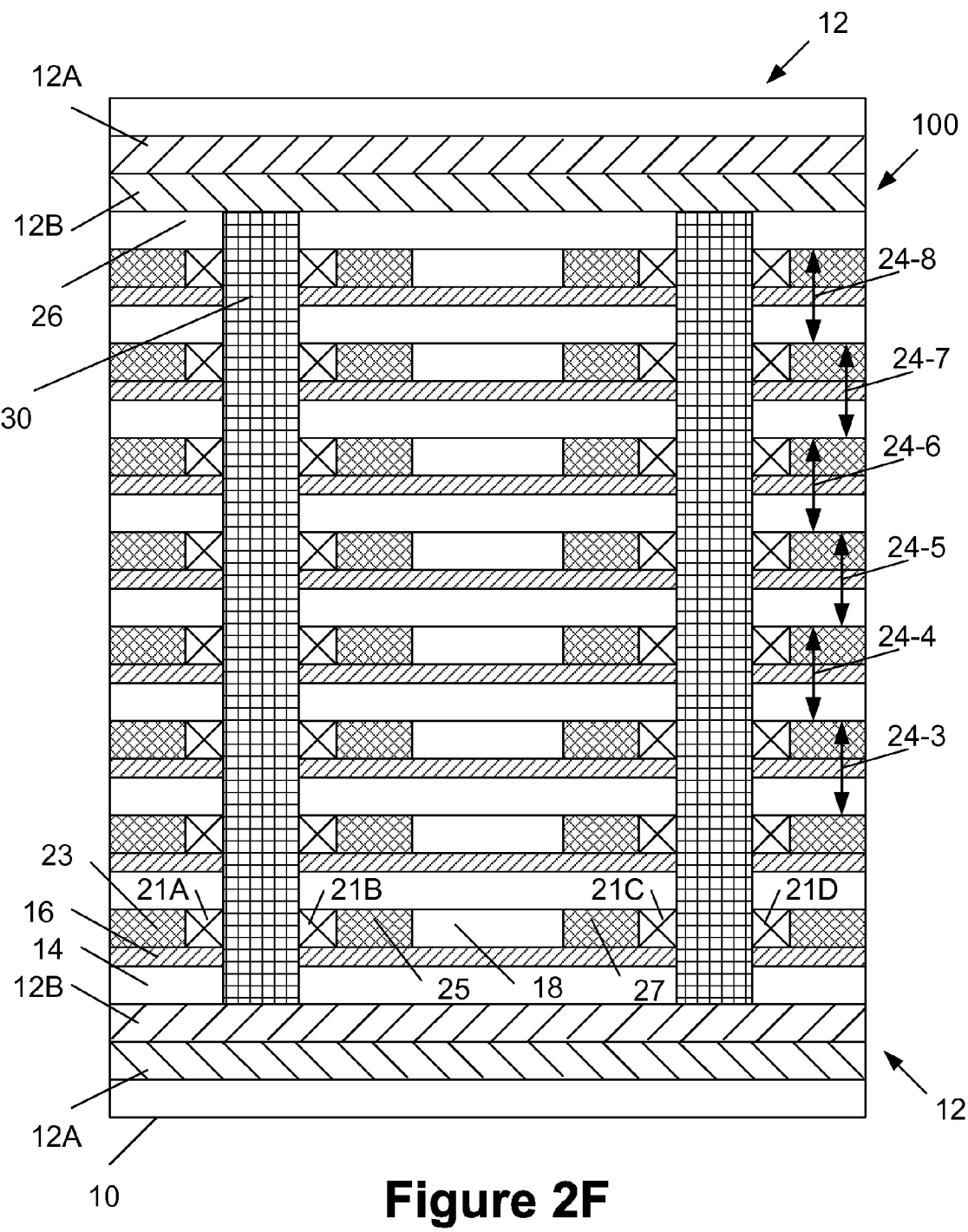
Figure 2G:
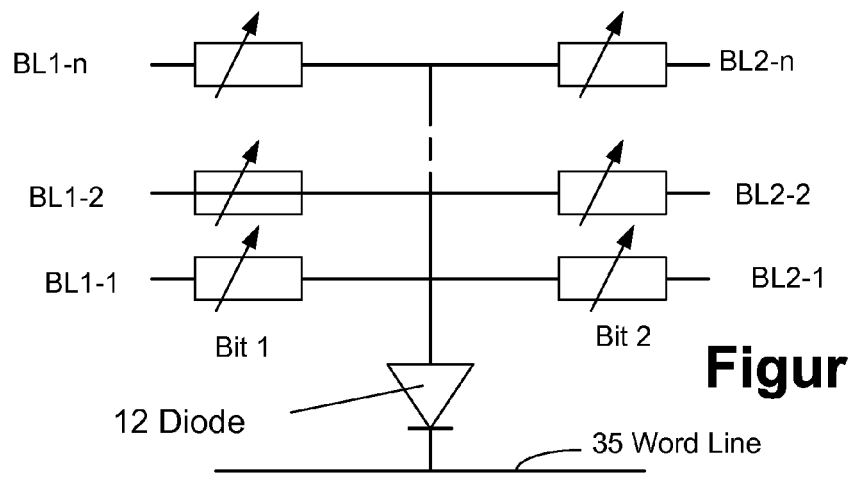
Figure 2H:
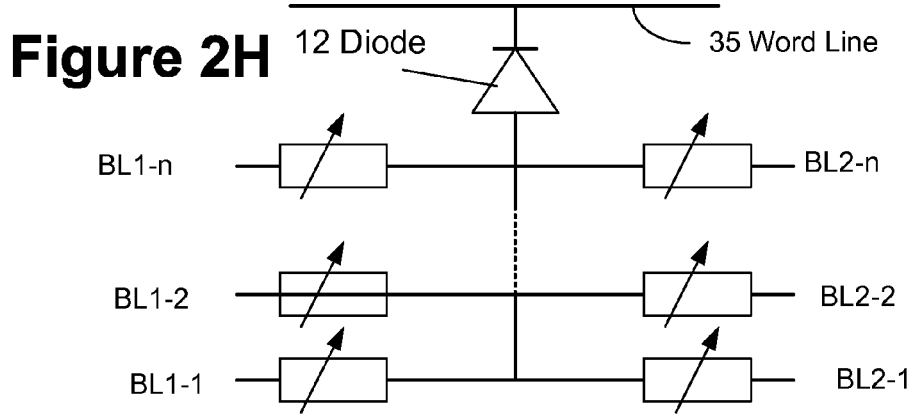
Figure 2I:
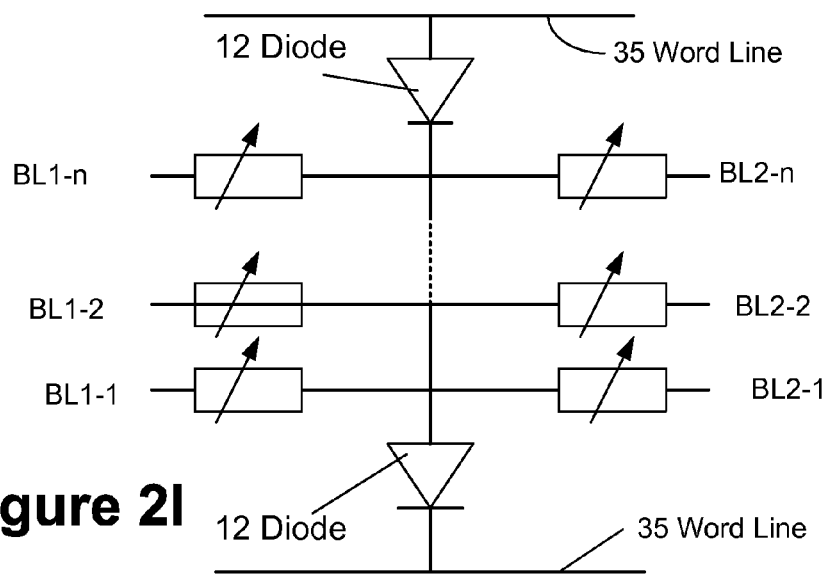

FIG. 2B depicts one illustrative embodiment of the device 100 wherein the diode 12 and the word line 35 are formed only at the bottom of the various bit stacks. FIG. 2E depicts an illustrative embodiment of the three dimensional RRAM device 100 wherein the diode 12 and the word line 35 are formed only at the top of the various stacked bit lines of the device 100. FIG. 2F depicts an illustrative embodiment of the three dimensional RRAM device 100 wherein diodes 12 and word lines 35 are formed above and below the various layers of stacked bit lines. In the cases where the illustrative embodiments of the three dimensional RRAM device 100 have only a single diode 12 and a single word line 35, they may be operated on a unipolar basis, wherein a change in the magnitude of any electrical field (or current flow) associated with the applied voltage may cause whichever of the separated RRAM cells 21A, 21B, 21C and 21D is selected to change its resistive state. In the case where embodiments of the device 100 have two diodes 12 and word lines 35, like the one depicted in FIG. 2F, the device may be operated on a bipolar basis wherein a change in polarity of the electrical field caused by an applied voltage causes whichever of the separated RRAM cells 21A, 21B, 21C and 21D is selected to change its resistive state. FIGS. 2G, 2H and 2I are electrical schematics for the illustrative embodiments of the device 100 depicted in FIGS. 2B, 2E and 2F, respectively.

Figure 2J:
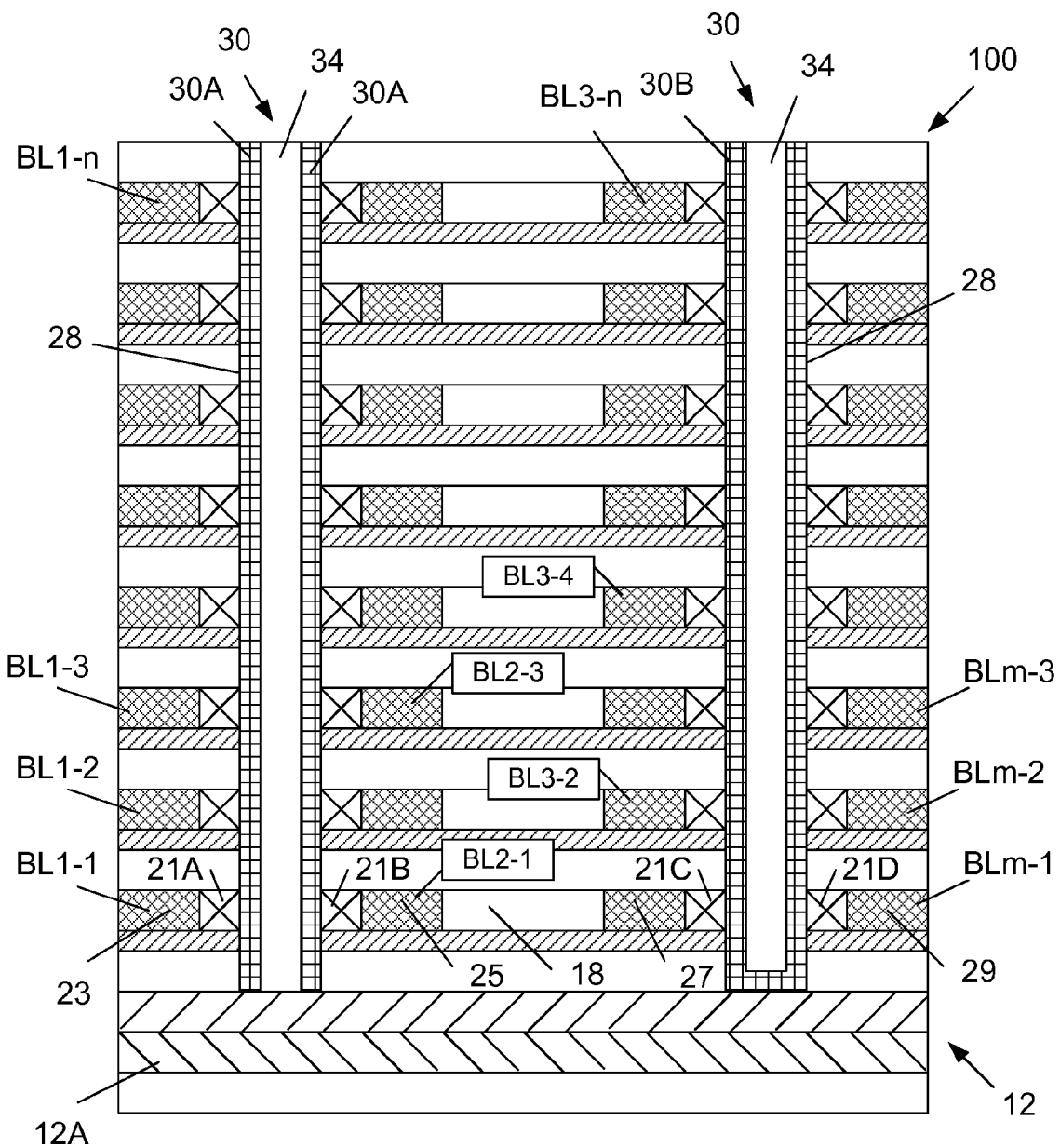

FIG. 2J depicts alternative embodiments for the configuration of the illustrative common electrodes 30. In FIG. 2B, the common electrodes 30 may be a conductive material that fills substantially all of the openings 28. The left side of FIG. 2J depicts the illustrative example wherein the common electrode 30 may take the form of a plurality of conductive sidewall spacers 30A having a layer of insulating material 34 positioned therebetween. The right hand side of FIG. 2J depicts the illustrative example where the common electrode 30 may take the form of a conductive liner 30B with the layer of insulating material 34 positioned in the remaining portions of the opening 28.

Figure 2K:
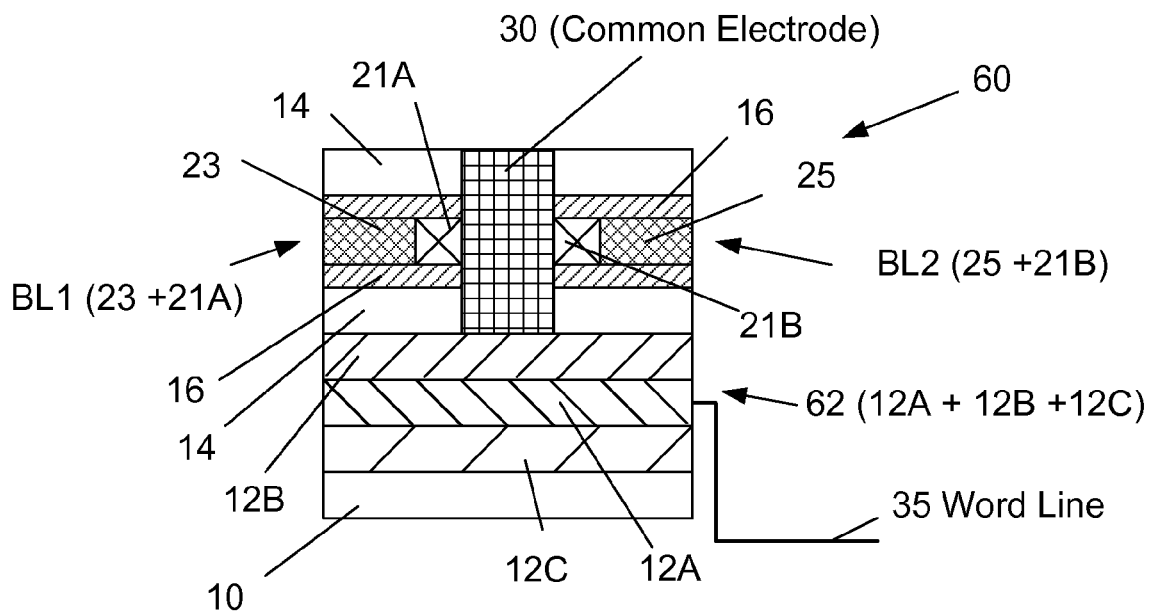
Figure 2L:
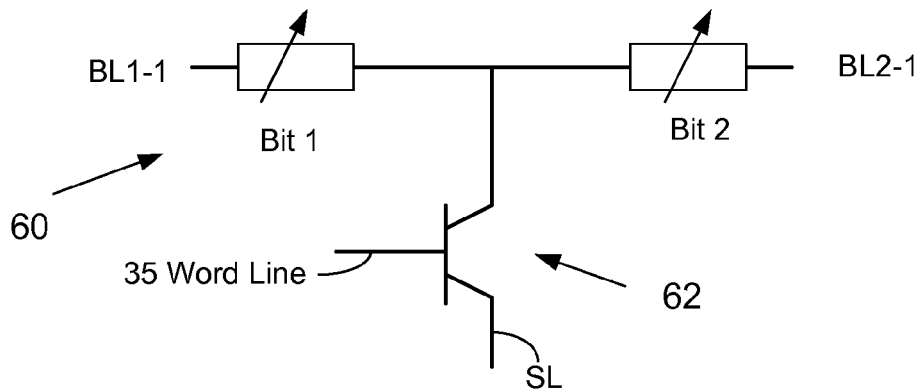

FIGS. 2K and 2L depict another illustrative embodiment of an illustrative three dimensional RRAM device disclosed herein. More specifically, FIG. 2K depicts an illustrative unit cell 60 of such a device 100, while FIG. 2L is an electrical schematic of such an illustrative unit cell 60. In general, relative to the illustrative unit cell 50 depicted in FIGS. 2B and 2D, the unit cell 60 comprises a bipolar junction (BJT) transistor 62 as a means of accessing the memory array of the device 100. The structure and function of such a BJT device 62 are well known to those skilled in the art. In general, the BJT transistor 62 may be either an NPN transistor or a PNP transistor. FIG. 2K depicts the formation of another illustrative material layer 12C on the structure 10 of the device 100. The layer 12C may be doped with either an N-type dopant or a P-type dopant depending upon the type of device under construction and the doping of the other layers 12A, 12B. The layer 12C may be formed prior to forming the layers 12A, 12B. In this embodiment, the word line 35 is coupled to the base of the BJT transistor 62. In operation, two inputs (on the word line and the source line (SL) are required to access the bit lines. In this embodiment, the access/selector device for the RRAM cells 21A, 21B includes the BJT transistor 62. As before, in this illustrative embodiment, the word line may take a variety of forms. For example, the doped layer positioned between the two outer doped layers, in this case doped layer 12A, may also function as a word line, or a separate metal line or a conductive contact that may be formed that is ultimately conductively coupled to the doped layer 12A.

In general, after an RRAM device is initially fabricated, the variable resistance material layer, e.g., the RRAM cells 21A, 21B, 21C and 21D, typically does not exhibit any switching properties. Rather, a so-called "FORMING" process, a high-voltage, high-current process, is typically performed to initially form a localized conductive filament that establishes a low-resistance state (LRS) exhibiting a relatively high current flow. However, for some materials, such a FORMING process is not required. A so-called "RESET" process is performed to break the conductive filament and establish a high-resistance state (HRS) exhibiting a relatively low current flow. Note that the RESET process destroys only a portion of the entire length of the conductive filament, i.e., the RESET process does not destroy the entire conductive filament. After a RESET process is performed, a so-called "SET" process is performed to reestablish the conductive filament and thus the low-resistance state of the RRAM device. The SET process is essentially the same as the FORMING process except that the SET process is performed at a lower voltage than the FORMING process since the filament length to be reestablished is shorter than the length of the conductive filament that was formed during the FORMING process.

The tables below sets forth various illustrative voltages that may be applied to the device 100 to perform FORMING, SET, RESET and READ operations when various bit lines and word lines are selected (Sel) or unselected (Unsel). Table I below is an example of the FORMING, SET, RESET and READ operations for an illustrative three dimensional RRAM device 100 with a single word line 12, such as those depicted in FIGS. 2B and 2E.

TABLE I

| Operation | BL-Sel | BL-Unsel | WL-Sel | WL-Unsel |
|---|---|---|---|---|
| Forming | $V_{Form,High}$ | Float | $V_{Form,Sel}$ | Float |
| Set | $V_{Set,High}$ | Float | $V_{Set,Sel}$ | Float |
| Reset (Unipolar) | $V_{Reset,High}$ | Float | $V_{Reset,Sel}$ | Float |
| Read | $V_{Read,High}$ | Float | $V_{Read,Sel}$ | Float |

Table II below is an example of the FORMING, SET, RESET and READ operations for an illustrative three dimensional RRAM device 100 with dual word lines 12, such as the illustrative embodiment depicted in FIG. 2F.

TABLE II

| Operation | BL-Sel | BL-Unsel | WL-Sel | WL-Unsel | WL'-Sel | WL'-Unsel |
|---|---|---|---|---|---|---|
| Forming | $V_{Form,High}$ | Float | $V_{Form,Sel}$ | Float | Float | Float |
| Set | $V_{Set,High}$ | Float | $V_{Set,Sel}$ | Float | Float | Float |
| Reset (Bipolar) | $V_{Reset,High}$ | Float | Float | Float | $V_{Reset,Sel}$ | Float |
| Read | $V_{Read,High}$ | Float | $V_{Read,Sel}$ | Float | Float | Float |

Table III below is an example of the FORMING, SET, RESET and READ operations for an illustrative three dimensional RRAM device 100 with a BJT selector transistor 62, such as the illustrative embodiment depicted in FIG. 2K.

TABLE III

| Operation | BL-Sel | BL-Unsel | WL-Sel | WL-Unsel | SL-Sel | SL-Unsel |
|---|---|---|---|---|---|---|
| Forming | $V_{Form,High}$ | Float | $V_{Form,Sel}$ | Float | $V_{Low}$ | $V_{Low}$ |
| Set | $V_{Set,High}$ | Float | $V_{Set,Sel}$ | Float | $V_{Low}$ | $V_{Low}$ |
| Reset (Unipolar) | $V_{Reset,High}$ | Float | $V_{Reset,Sel}$ | Float | $V_{Low}$ | $V_{Low}$ |
| Reset (Bipolar) | $V_{Reset,Low}$ | Float | $V_{Reset,Sel}$ | Float | $V_{High}$ | $V_{High}$ |
| Read | $V_{Read,High}$ | Float | $V_{Read,Sel}$ | Float | $V_{Low}$ | $V_{Low}$ |

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An RRAM device, comprising:
a first electrode for a first bit line;
a second electrode for a second bit line;
a common electrode positioned between said first and second electrodes, said common electrode having first and second ends;
a diode coupled to said first end of said common electrode;
a first variable resistance material layer positioned between and contacting said first electrode and said common electrode; and
a second variable resistance material layer positioned between and contacting said second electrode and said common electrode.

2. The device of claim 1, wherein said diode comprises a bipolar junction transistor.

3. The device of claim 2, wherein said bipolar junction transistor is comprised of first, second and third doped layers of material, wherein said second doped layer of material is positioned between said first and third doped layers of material, and wherein said first and third doped layers of material are doped with a first type of dopant material and said second doped layer of material is doped with a second type dopant that is a type dopant that is opposite said first type of dopant, and wherein said device further comprises a conductive word line that is conductively coupled to said second doped layer of material.

4. The device of claim 1, further comprising a conductive word line, wherein said diode is positioned between said conductive word line and said common electrode and wherein said diode is conductively coupled to both said conductive word line and said common electrode.

5. The device of claim 1, wherein said diode comprises a first doped layer of material that is doped with a first type of dopant.

6. The device of claim 5, further comprising a second doped layer of material that is positioned between said conductive word line and said common electrode, wherein said second doped layer is doped with a second type dopant that is a type dopant that is opposite said first type of dopant.

7. The device of claim 1, wherein said diode is positioned in a first perpendicular orientation with respect to said common electrode.

8. The device of claim 7, wherein said diode is positioned in a second perpendicular orientation with respect to said first and second electrodes.

9. The device of claim 1, further comprising a structure having an upper surface, wherein said first variable resistance material is formed above said structure and has an upper surface that is substantially planar with an upper surface of said first electrode, is positioned at a level that is below a level of said upper surface of said common electrode, and is parallel with the upper surface of said structure, said second variable resistance material layer is formed above said structure and has an upper surface that is substantially planar with an upper surface of said second electrode, is positioned at a level that is below the level of said upper surface of said common electrode, and is parallel with the upper surface of said structure, and said common electrode is positioned perpendicular to the upper surface of said structure.

10. An RRAM device, comprising:
a first electrode for a first bit line comprising a variable resistance material;
a second electrode for a second bit line comprising a variable resistance material;
a third electrode having first and second ends and being positioned between and contacting said variable resistance material of said first bit line and said variable resistance material of said second bit line; and
a diode coupled to said first end of said third electrode.

11. The device of claim 10, wherein said third electrode is a common electrode.

12. The device of claim 10, wherein said diode comprises a bipolar junction transistor.

13. The device of claim 10, further comprising a conductive word line, wherein said diode is positioned between said conductive word line and said third electrode and wherein said diode is conductively coupled to both said conductive word line and said third electrode.

14. The device of claim 13, wherein said conductive word line is one of a first doped layer of material that is doped with a first type of dopant or a metal line.

15. The device of claim 10, wherein said diode is positioned in a first perpendicular orientation with respect to said third electrode.

16. The device of claim 15, wherein said diode is positioned in a second perpendicular orientation with respect to said first and second electrodes.

17. The device of claim 10, further comprising a structure having an upper surface, wherein said first electrode and said first bit line are formed above said structure and have upper surfaces that are substantially planar with one another, are positioned at a first level, and are parallel with the upper surface of said structure, said second electrode and said second bit line are formed above said structure and have upper surfaces that are substantially planar with one another, are positioned at a second level that is substantially level with said first level, and are parallel with the upper surface of said structure, and said third electrode is positioned perpendicular to the upper surface of said structure and has an upper surface at said second end that is positioned at a third level that is above said first and second levels.

18. An RRAM device, comprising:
a plurality of stacked bit levels, wherein each bit level comprises:
a first electrode for a first bit line comprising a first variable resistance material;

a second electrode for a second bit line comprising a second variable resistance material;

a third electrode having first and second ends and that extends through said plurality of stacked bit levels, wherein, for each of said bit levels, said third electrode is positioned between and contacting said first variable resistance material of said first bit line and said second variable resistance material of said second bit line; and a diode coupled to said first end of said third electrode.

19. The device of claim 18, wherein said third electrode is a common electrode.

20. The device of claim 18, further comprising and a conductive word line, wherein said diode is positioned between said conductive word line and said third electrode and wherein said diode is conductively coupled to both said conductive word line and said third electrode.

21. The device of claim 18, further comprising a bipolar junction transistor that is conductively coupled to said third electrode.

22. The device of claim 18, further comprising a conductive word line that is conductively coupled to an access/selector device.

23. The device of claim 22, wherein said conductive word line is one of a first doped layer of material that is doped with a first type of dopant or a metal line.

24. The device of claim 18, wherein said diode is positioned in a first perpendicular orientation with respect to said third electrode.

25. The device of claim 24, wherein said diode is positioned in a second perpendicular orientation with respect to said first and second electrodes.

26. The device of claim 18, further comprising a structure, wherein said first variable resistance material is formed above said structure and has an upper surface that is substantially planar with an upper surface of said first electrode and parallel to the upper surface of said structure, wherein said second electrode is formed above said structure, has an upper surface that is substantially planar with an upper surface of said second variable resistance material, and is parallel with said upper surface of said structure, and said third electrode is positioned perpendicular to said upper surface of said structure.

* * * * *